(12) United States Patent
Matsubara et al.

(10) Patent No.: US 11,115,017 B2
(45) Date of Patent: Sep. 7, 2021

(54) DRIVING APPARATUS AND SWITCHING APPARATUS

(71) Applicant: FUJI ELECTRIC CO., LTD., Kanagawa (JP)

(72) Inventors: Kunio Matsubara, Hino (JP); Tsuyoshi Nagano, Hino (JP)

(73) Assignee: FUJI ELECTRIC CO., LTD., Kanagawa (JP)

( * ) Notice: Subject to any disclaimer, the term of this patent is extended or adjusted under 35 U.S.C. 154(b) by 25 days.

(21) Appl. No.: 16/794,222

(22) Filed: Feb. 19, 2020

(65) Prior Publication Data
US 2020/0389164 A1 Dec. 10, 2020

(30) Foreign Application Priority Data

Jun. 10, 2019 (JP) .............................. JP2019-108193

(51) Int. Cl.
| | |
|---|---|
| *H03K 17/082* | (2006.01) |
| *H02H 3/16* | (2006.01) |
| *H02H 1/00* | (2006.01) |
| *H03K 17/28* | (2006.01) |
| *H03K 17/06* | (2006.01) |
| *H03K 17/16* | (2006.01) |
| *H02H 3/10* | (2006.01) |

(52) U.S. Cl.
CPC ....... *H03K 17/0822* (2013.01); *H02H 1/0007* (2013.01); *H02H 3/16* (2013.01); *H02H 3/10* (2013.01); *H03K 17/06* (2013.01); *H03K 17/063* (2013.01); *H03K 17/082* (2013.01); *H03K 17/16* (2013.01); *H03K 17/28* (2013.01)

(58) Field of Classification Search
CPC .... H03K 17/082; H03K 17/06; H03K 17/063; H03K 17/0822; H03K 17/28; H03K 17/16; H03K 17/168; H03K 17/162; H02H 1/00; H02H 3/16; H02H 1/0007; H02H 3/10
USPC .................................... 361/86–87, 93.7–93.9
See application file for complete search history.

(56) References Cited

U.S. PATENT DOCUMENTS

| | | | |
|---|---|---|---|
| 10,505,535 B2 | 12/2019 | Matsubara | |
| 2011/0096445 A1* | 4/2011 | Truong | H02M 1/32 |
| | | | 361/18 |

(Continued)

FOREIGN PATENT DOCUMENTS

| | | |
|---|---|---|
| JP | 2007259533 A | 10/2007 |
| JP | 5729472 B2 | 6/2015 |
| JP | 6168253 B1 | 7/2017 |

*Primary Examiner* — Danny Nguyen

(57) ABSTRACT

Provided is a driving apparatus that includes a gate driving circuit that turns off a first semiconductor element upon receiving a turn-off signal, a measuring circuit that measures a parameter according to a voltage applied to the second semiconductor element, a timing generating circuit that generates a timing signal if the parameter satisfies a first condition during a time period in which the first semiconductor element is tuned off; and a driving condition change circuit that, in response to the timing signal, further decreases a changing speed of a gate voltage of the first semiconductor element than a reference speed during the time period in which the first semiconductor element is tuned off, wherein the gate driving circuit turns off the first semiconductor element in response to that the parameter satisfies a second condition during a time period in which the first semiconductor element is tuned on.

16 Claims, 4 Drawing Sheets

(56) References Cited

U.S. PATENT DOCUMENTS

2014/0192449 A1     7/2014   Shimizu
2018/0316344 A1*   11/2018   Matsubara ........... H03K 17/162

* cited by examiner

DRIVING APPARATUS AND SWITCHING APPARATUS

The contents of the following Japanese patent application(s) are incorporated herein by reference:
2019-108193 filed in JP on Jun. 10, 2019

BACKGROUND

1. Technical Field

The present invention relates to a driving apparatus and a switching apparatus.

2. Related Art

Conventionally, in a driving apparatus for driving a semiconductor element, an active gate driving method of changing a changing speed of a gate voltage during a turn-off period is adopted to decrease a switching loss and suppress a voltage overshoot at a time of turning off a semiconductor element (for example, see Patent Document 1). Further, various methods of protecting an element by detecting a short circuit are proposed (for example, see Patent Documents 2, 3). Patent Document 1: Japanese Patent No. 6168253
Patent Document 2: Japanese Patent Application Publication No. 2007-259533
Patent Document 3: Japanese Patent No. 5729472

However, provision of a structure for protecting a short-circuit in a driving apparatus increases an apparatus in size.

SUMMARY

To solve the above-mentioned issue, in a first aspect of the present invention, a driving apparatus is provided. The driving apparatus may include a gate driving circuit that turns off a first semiconductor element in response to receiving a signal for turning off the first semiconductor element included in the first semiconductor element and a second semiconductor element connected in series between a positive side power supply line and a negative side power supply line. The driving apparatus may include a measuring circuit that measures a parameter according to a voltage applied to the second semiconductor element. The driving apparatus may include a timing generating circuit that generates a first timing signal if the parameter satisfies a first condition during a time period in which the first semiconductor element is tuned off. The driving apparatus may include a driving condition change circuit that, in response to the first timing signal, further decreases a changing speed of a gate voltage of the first semiconductor element than a reference speed during the time period in which the first semiconductor element is tuned off. The gate driving circuit may turn off the first semiconductor element also in response to that the parameter satisfies a second condition during a time period in which the first semiconductor element is turned on.

The gate driving circuit may turn off the first semiconductor element in response to that the parameter satisfies the second condition at or after a time point at which a reference time has elapsed after turning on the first semiconductor element.

The timing generating circuit may generate a second timing signal if the parameter satisfies a second condition during a time period in which the first semiconductor element is turned on. The driving condition change circuit, in response to the second timing signal, may further decrease the changing speed of the gate voltage than the reference speed during a time period in which the first semiconductor element is turned off.

The timing generating circuit generates the first timing signal having a predetermined first pulse width. The driving condition change circuit may decrease the changing speed of the gate voltage while the first timing signal is generated after receiving the first timing signal.

The timing generating circuit may generate the second timing signal having a predetermined second pulse width larger than the first pulse width. The driving condition change circuit may decrease the changing speed of the gate voltage while the second timing signal is generated after receiving the second timing signal.

The second pulse width may be larger than a time width from a start to an end of a turn-off of the first semiconductor element.

The driving apparatus may include a first determination circuit that determines whether the parameter satisfies the first condition. The driving apparatus may include a second determination circuit that determines whether the parameter satisfies the second condition.

The first condition and the second condition may be the same conditions. The first determination circuit and the second determination circuit may be the same circuits.

The parameter may indicate a voltage applied to the second semiconductor element.

The second condition may be a condition in which a voltage applied to the second semiconductor element is a second reference voltage or less. The second reference voltage may be less than a voltage between the positive side power supply line and the negative side power supply line.

The first condition may be a condition in which a voltage applied to the second semiconductor element is a first reference voltage or less. The second condition may be a condition in which a voltage applied to the second semiconductor element is a second reference voltage or less. At least one of the first reference voltage and the second reference voltage may be 0 V.

The parameter may indicate a voltage applied to the first semiconductor element.

The second condition may be a condition in which a voltage applied to the first semiconductor element is a fourth reference voltage or more. The fourth reference voltage may be larger than 0 V.

The first condition may be a condition in which a voltage applied to the first semiconductor element is a third reference voltage or more. The second condition may be a condition in which a voltage applied to the first semiconductor element is a fourth reference voltage or more. At least one of the third reference voltage and the fourth reference voltage may be equal to or greater than a voltage between the positive side power supply line and the negative side power supply line.

In a second aspect of the present invention, a switching apparatus is provided. The switching apparatus may include two semiconductor elements connected in series between a positive side power supply line and a negative side power supply line. The switching apparatus may include the driving apparatus according to the first aspect that drives a gate of one of the two semiconductor elements. The switching apparatus may include the driving apparatus according to the first aspect that drives a gate of the other of the two semiconductor elements.

The two semiconductor elements may be wide bandgap semiconductor elements.

The summary clause does not necessarily describe all necessary features of the embodiments of the present invention. The present invention may also be a sub-combination of the features described above.

DESCRIPTION OF EXEMPLARY EMBODIMENTS

Hereinafter, the present invention will be described with reference to embodiments of the invention. However, the following embodiments should not to be construed as limiting the claimed invention. Moreover, all the features of the combinations described in the embodiments are not necessarily essential as means for solving the problems of the invention.

[1. Switching Apparatus 1]

Figure 1:
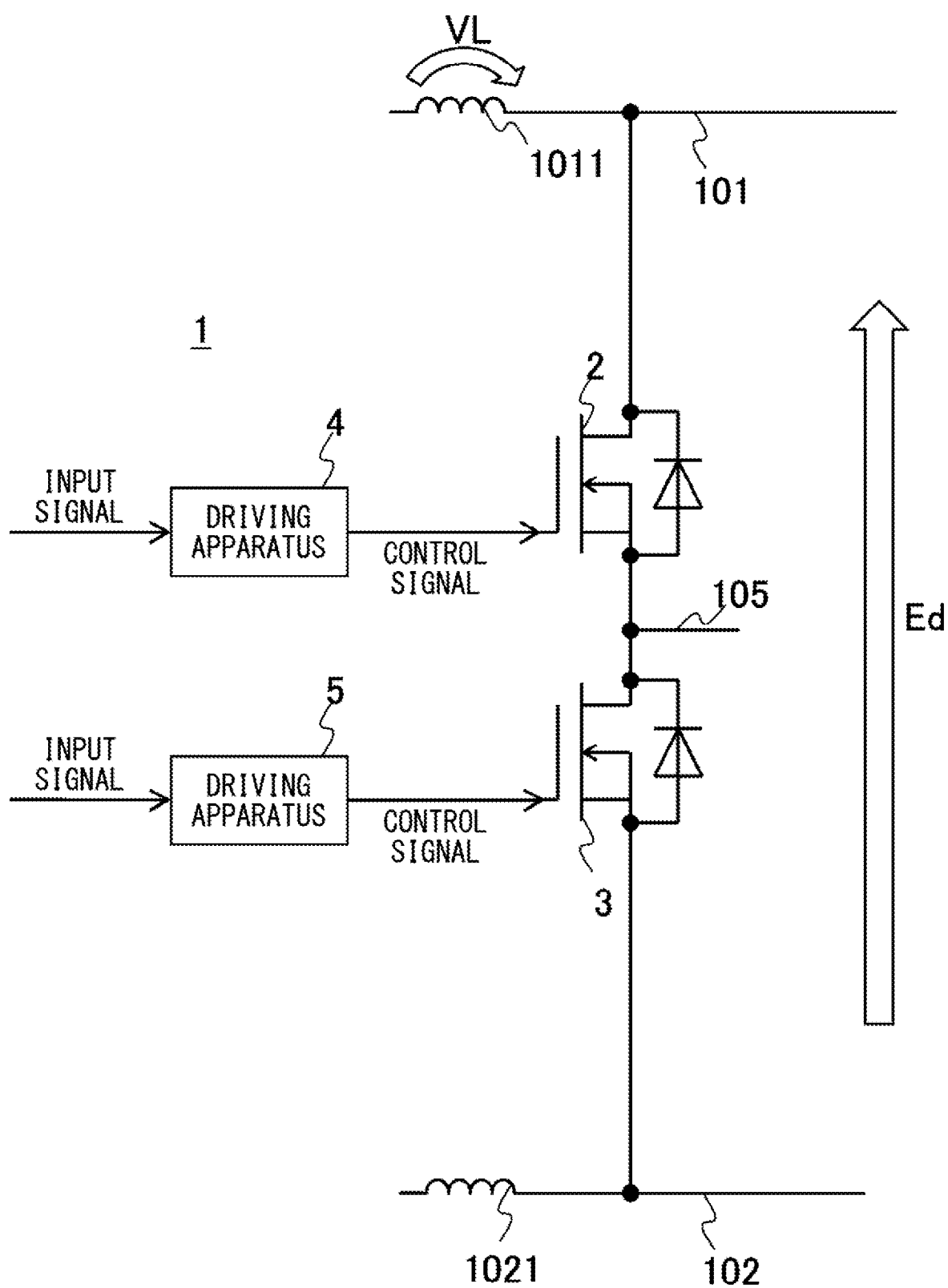
FIG. 1 illustrates a switching apparatus 1 according to the present embodiment.

FIG. 1 illustrates a switching apparatus 1 according to the present embodiment. Outline arrows in the figure indicates voltage.

The switching apparatus 1 shows a portion of one phase of a power conversion apparatus used for driving motors or supplying electric power, as one example, and outputs converted voltage from a power supply output terminal 105 by switching connections between the power supply output terminal 105 and a positive side power supply line 101 and between the power supply output terminal 105 and a negative side power supply line 102. The switching apparatus 1 includes semiconductor elements 2, 3 and driving apparatuses 4, 5.

DC voltage Ed of, for example, 600 to 800 V is applied between the positive side power supply line 101 and the negative side power supply line 102. Also, the positive side power supply line 101 and the negative side power supply line 102 may have wiring inductances 1011, 1021 depending on their respective wiring lengths respectively.

[1-1. Semiconductor Elements 2, 3]

The semiconductor elements 2, 3 are one example of a first semiconductor element and a second semiconductor element and are connected sequentially in series between the negative side power supply line 102 and the positive side power supply line 101. The power supply output terminal 105 may be connected to a midpoint between the semiconductor elements 2, 3.

The semiconductor elements 2, 3 are switching elements which are switched on/off by driving apparatuses 4, 5 described later. As one example, the semiconductor elements 2, 3 constitute an upper arm and a lower arm of a power conversion apparatus.

The semiconductor elements 2, 3 are silicon semiconductor elements having silicon as base materials. The semiconductor elements 2, 3 are not limited to silicon semiconductor elements, but may be wide bandgap semiconductor elements. A wide bandgap semiconductor element is a semiconductor element that has greater bandgap than that of a silicon semiconductor element, for example, and is a semiconductor element including SiC, GaN, diamond, gallium nitride-based material, gallium oxide-based material, AlN, AlGaN, ZnO, or the like. A switching speed can be more improved in a case of using a wide bandgap semiconductor element than in a case of using a silicon semiconductor element.

As one example, in the present embodiment, the semiconductor elements 2, 3 are MOSFETs and have a parasitic diode whose cathode is closer to the positive side power supply line 101 (illustrated in FIG. 1). For the semiconductor elements 2, 3, a semiconductor element having other structures such as an IGBT or a bipolar transistor can be applied, and diodes, schottky barrier diodes etc. are connected in inverse-parallel to the respective semiconductor elements when necessary.

[1-2. Driving Apparatuses 4, 5]

The driving apparatuses 4, 5 drive one and the other of the semiconductor elements 2, 3 based on a signal input from an outside. As one example, in the present embodiment, a driving apparatus 4 on a positive side drives a gate of the semiconductor element 2 and a driving apparatus 5 on a negative side drives a gate of the semiconductor element 3.

When switching on the semiconductor elements 2, 3 alternately, the driving apparatuses 4, 5 may turn on the other element after turning off one element to switch off. The driving apparatuses 4, 5 reduce turn-off loss and suppress voltage overshoot by switching a changing speed of the among of gate charge of the semiconductor elements 2, 3 to be turned off, i.e., by switching a changing speed of a gate voltage (Vgs) that is a gate-source voltage of the semiconductor elements 2, 3 to be turned off during a turn-off period of the semiconductor elements 2, 3 (in the present embodiment, a period from the start to the end of turn-off as one example).

[2. Details of Driving Apparatus 5]

Figure 2:
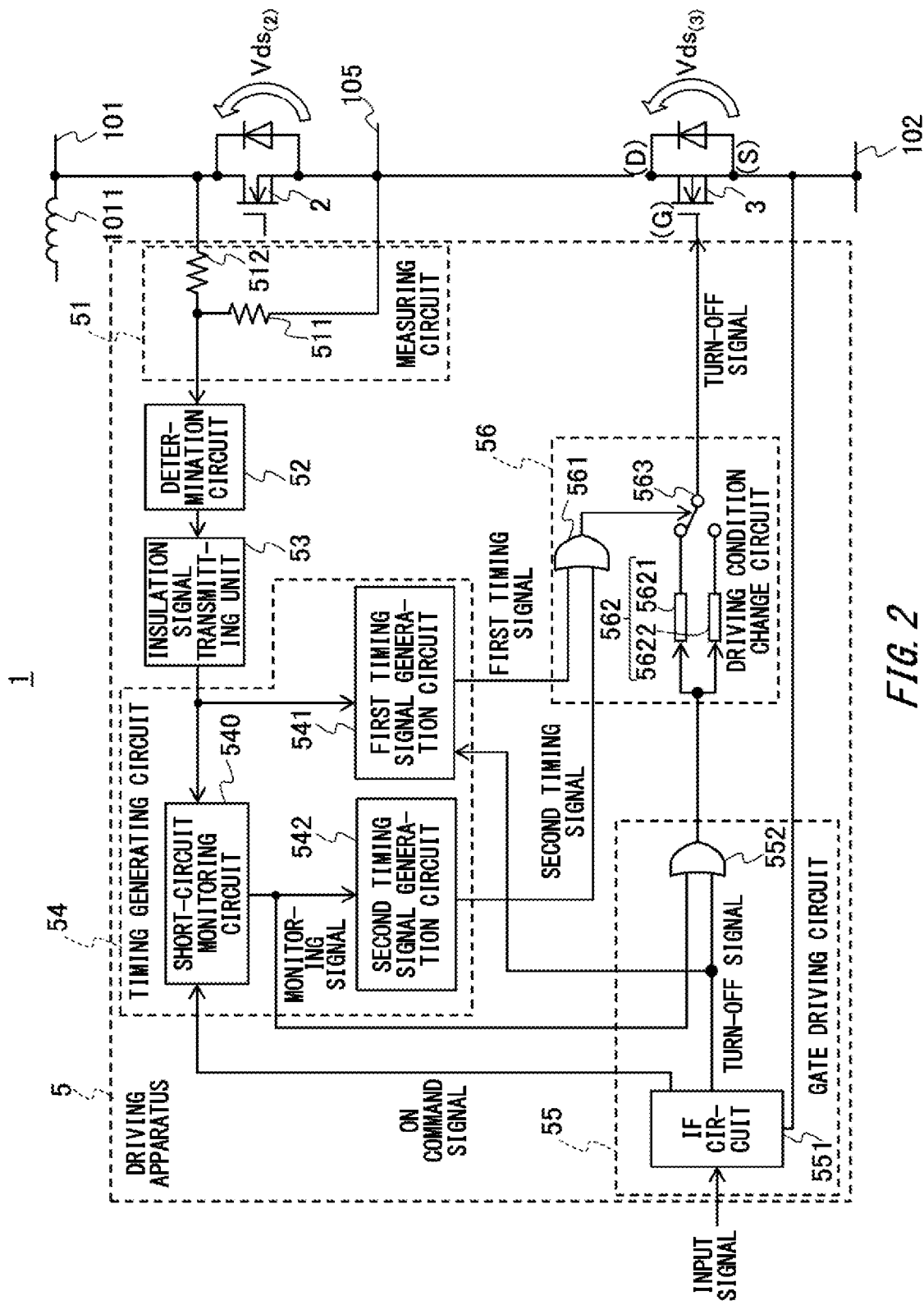
FIG. 2 illustrates details of a driving apparatus 5.

FIG. 2 illustrates details of the driving apparatus 5. Descriptions thereof are omitted because the driving apparatus 4 has the same structure as the driving apparatus 5. FIG. 2 only illustrates a structure in a case where the semiconductor element 3 is turned off among structures of the driving apparatus 5 and a structure in a case where the semiconductor element 3 is turned on is omitted.

The driving apparatus 5 includes a measuring circuit 51, a determination circuit 52, an insulation signal transmitting unit 53, a timing generating circuit 54, a gate driving circuit 55, and a driving condition change circuit 56.

[2-1. Measuring Circuit 51]

The measuring circuit 51 measures a parameter depending on voltage applied to the semiconductor element 2 on an opposing arm side. The parameter may represent the voltage itself applied to the semiconductor element 2 and in the present embodiment, represents a drain-source voltage $Vds_{(2)}$ of the semiconductor element 2 as one example.

The measuring circuit 51 includes resistances 511, 512. The resistances 511, 512 divide the drain-source voltage $Vds_{(2)}$ of the semiconductor element 2. The resistances 511, 512 are connected in parallel to the semiconductor element 2 and have a determination circuit 52 connected therebetween.

[2-2. Determination Circuit 52]

The determination circuit 52 is one example of a first determination circuit and determines whether a parameter satisfies a first condition. Further, the determination circuit 52 is one example of a second determination circuit and determines whether a parameter satisfies a second condition. The determination circuit 52 may supply a determination result to the timing generating circuit 54 via the insulation signal transmitting unit 53.

The first condition may be a condition for switching a changing speed of a gate voltage. The first condition may be, for example, a condition in which the voltage $Vds_{(2)}$ applied to the semiconductor element 2 on the opposing arm side is a first reference voltage or less.

During the turn-off period of the semiconductor element 3, the drain-source voltage $Vds_{(2)}$ of the semiconductor element 2 on the opposing arm side decreases and eventually becomes zero in response to that the drain-source voltage $Vds_{(3)}$ of the semiconductor element 3 increases up to a DC voltage Ed between the positive side power supply line 101 and the negative side power supply line 102. However, at this time, the discharge from a parasitic capacitance of the semiconductor element 2 on the opposing arm side is prevented by a wiring inductance 1011 of the positive side power supply line 101, and thus, the voltage $Vds_{(3)}$ of the semiconductor element 2 does not become zero yet even if the voltage $Vds_{(3)}$ of the semiconductor element 3 becomes a DC voltage Ed. A first reference voltage is set to reduce a turn-off loss and also suppress a voltage overshoot by appropriately setting a change timing of a driving condition of the semiconductor element 3 even in such a case.

The first reference voltage may be smaller than the voltage $Vds_{(2)}$ applied to the semiconductor element 2 on the opposing arm side at a moment at which the drain-source voltage $Vds_{(3)}$ of the semiconductor element 3 to be turned off is the DC voltage Ed or more between the positive side power supply line 101 and the negative side power supply line 102. The first reference voltage may be, for example, the drain-source voltage $Vds_{(2)}$ in a case where drain current in the semiconductor element 2 on the opposing arm side starts commutation in a parasitic diode or a diode connected in inverse-parallel. As a result, during a turn-off period of the semiconductor element 3 to be switched, it is determined that a parameter satisfies a first condition in accordance with a timing at which the voltage $Vds_{(2)}$ applied to the semiconductor element 2 on the opposing arm side decreases and becomes the first reference voltage or less. In the present embodiment, as one example, a first reference voltage is 0V, or 0V excluding error. If seen from the semiconductor element 3 to be turned off, a first reference voltage is a DC voltage Ed or more in value.

A second condition may be a condition for protecting an element from a short circuit. For example, the second condition may be a condition in which voltage applied to the semiconductor element 2 on the opposing arm side is a second reference voltage or less.

The second reference voltage may be smaller than voltage applied to the the semiconductor element 2 during a time period in which the semiconductor element 3 to be switched is in an ON state, i.e., during a time period in which the semiconductor element 2 on the opposing arm side is in an OFF state. In this case, a feature that a parameter satisfies a second condition in a case in a case where the semiconductor element 3 is in an ON state means that the semiconductor element 2 in the opposing arm side is not in an OFF state, and thus, means that the short circuit is occurring. The second reference voltage may be less than voltage (in the present embodiment, voltage Ed as one example) between the positive side power supply line 101 and the negative side power supply line 102. In the present embodiment, as one example, the second reference voltage is 0V, or 0V excluding error. That is, in the present embodiment, as one example, the second reference voltage is equal to the first reference voltage, in other words, the second condition is the same as the first condition.

[2-3. Insulation Signal Transmitting Unit 53]

The insulation signal transmitting unit 53 is provided between the determination circuit 52 and the timing generating circuit 54. The insulation signal transmitting unit 53 may convert signal voltage from the determination circuit 52 and supplies the converted voltage to the timing generating circuit 54.

[2-4 Timing Generating Circuit 54]

The timing generating circuit 54 generates a timing signal for determining a control timing of the semiconductor element 3. The timing generating circuit 54 includes a first timing signal generation circuit 541, a short-circuit monitoring circuit 540, and a second timing signal generation circuit 542.

The first timing signal generation circuit 541 generates a first timing signal in a case where a parameter satisfies a first condition during a turn-off period of the semiconductor element 3 to be switched. The first timing signal generation circuit 541 may generate a first timing signal in response to that the determination circuit 52 determines that a parameter satisfies a first condition during a turn-off period of the semiconductor element 3. The first timing signal generation circuit 541 may detect the start of a turn-off period upon receiving, from the gate driving circuit 55, a turn-off signal for turning off the semiconductor element 3. The first timing signal may be a pulse signal having a predetermined first pulse width. The first timing signal generation circuit 541 may supply the first timing signal to the driving condition change circuit 56.

The short-circuit monitoring circuit 540 monitors whether the short circuit occurs between the positive side power supply line 101 and the negative side power supply line 102. For example, the short-circuit monitoring circuit 540 may detect the occurrence of the short circuit in response to that the determination circuit 52 determines that a parameter satisfies a second condition during a time period in which the semiconductor element 3 to be switched is turned on.

The short-circuit monitoring circuit 540 may monitor whether the short circuit occurs at or after a time point at which a reference time (also referred to as mask time period) has elapsed after the semiconductor element 3 is turned on. The short-circuit monitoring circuit 540 may detect the start of the turn-on of the semiconductor element 3 and an ON period of the semiconductor element 3 upon receiving, from the gate driving circuit 55, an on command signal for turning on the semiconductor element 3. The mask time period may be longer than a time period from when turn-on of the semiconductor element 3 begins until when current (in the present embodiment, as one example, drain current Id) flowing through the semiconductor element 3 reaches a peak. The short-circuit monitoring circuit 540 may supply a monitoring signal indicating whether there is the short circuit to the second timing signal generation circuit 542 and the gate driving circuit 55.

The second timing signal generation circuit 542 generates a second timing signal in a case where a parameter satisfies a second condition during a time period in which the semiconductor element 3 to be switched is turned on. The second timing signal generation circuit 542 may generates a second timing signal in response to a monitoring signal from the short-circuit monitoring circuit 540. The second timing signal may be a pulse signal having a larger predetermined second pulse width than a first pulse width. The second pulse width may be larger a time width from the start to the end of the turn-off of the semiconductor element 3. The second timing signal generation circuit 542 may supply the second timing signal to the driving condition change circuit 56.

[2-5. Gate Driving Circuit 55]

The gate driving circuit 55 drives a gate of the semiconductor element 3 to be switched based on an input signal. For example, the gate driving circuit 55 may turn off the semiconductor element 3 upon receiving an input signal (which is also referred to as off command signal) for turning off the semiconductor element 3. The gate driving circuit 55 may turn on the semiconductor element 3 upon receiving an input signal (which is also referred to as on command signal) for turning on the semiconductor element 3. The gate driving circuit 55 includes an IF circuit 551 and an OR gate 552.

The IF circuit 551 receives a signal to be input to the semiconductor element 3 from the outside the driving apparatus 5. The IF circuit 551 may supply, to a gate of the semiconductor element 3, a turn-on signal for turning on the semiconductor element 3 in response to receiving the on command signal as in an input signal via the driving condition change circuit 56. The IF circuit 551 may supply an on command signal as the input signal without any change to the short-circuit monitoring circuit 540 of the timing generating circuit 54. The IF circuit 551 may supply a turn-off signal for turning off the semiconductor element 3 in response to receiving an off command signal included in the input signal to the first timing signal generation circuit 541 of the timing generating circuit 54 while supplying it to a gate of the semiconductor element 3 via the driving condition change circuit 56. If the turn-off signal is supplied to the semiconductor element 3 in an ON state, a gate input capacitance $Cgs_{(3)}$ of the semiconductor element 3 is charged in a reverse bias direction (−Vgs), and accordingly, a state of the semiconductor element 3 is switched from an ON state to an OFF state.

The OR gate 552 is disposed on a turn-off signal path between the IF circuit 551 and the driving condition change circuit 56. The OR gate 552 supplies, as the turn-off signal from the semiconductor element 3, a signal obtained by taking the logical OR of the turn-off signal from the IF circuit 551 and a monitoring signal indicating the short circuit occurrence from the short-circuit monitoring circuit 540 to the driving condition change circuit 56. As a result, the gate driving circuit 55 turns off the semiconductor element 3 in response to receiving an input signal for turning off the semiconductor element 2 and also in response to that a parameter satisfies a second condition during a time period in which the semiconductor element 3 is turned on, As described above, the short-circuit monitoring circuit 540 monitors whether the short circuit occurs at or after a time point at which the mask time period has elapsed after returning on the semiconductor element 3. Accordingly, the gate driving circuit 55 turns off the semiconductor element 3 in response to that a parameter satisfies a second condition at or after a time point at which the mask time period has elapsed after turning on the semiconductor element 3.

[2.6 Driving Condition Change Circuit 56]

The driving condition change circuit 56 changes a condition for driving a gate of the semiconductor element 3. The driving condition change circuit 56 may further decrease a changing speed of a gate voltage of the semiconductor element 3 than a first speed during a turn-off period of the semiconductor element 3 and, in the present embodiment, as one example, may set it a second speed that is slower than the first speed in response to a first timing signal from the first timing signal generation circuit 541. The driving condition change circuit 56 may further decrease a changing speed of a gate voltage than a first speed during a turn-off period of the semiconductor element 3 and, in the present embodiment, as one example, may set it to a second speed that is slower than the first speed in response to a second timing signal from the second timing signal generation circuit 542. The driving condition change circuit 56 may decrease a changing speed of a gate voltage by decreasing a speed of implanting charges to a gate. The first speed is one example of a reference speed. In the present embodiment, as one example, a changing speed of a gate voltage set according to the first timing signal and a changing speed of a gate voltage set according to the second timing signal are set to be the same, but the two changing speeds may differ.

The driving condition change circuit 56 includes an OR gate 561, a gate resistance 562, and a switch 563. The OR gate 561 supplies, to the switch 563, a signal obtained by taking the logical OR of the first timing signal from the first timing signal generation circuit 541 and the second timing signal from the second timing signal generation circuit 542.

The gate resistance 562 includes two resistances 5621, 5622 having different resistance values each other. The resistance 5621 includes a resistance value in which a changing speed of a gate voltage of the semiconductor element 3 during a turn-off period is set to a first speed. Similarly, the resistance 5622 includes a resistance value in which a changing speed of a gate voltage of the semiconductor element 3 during a turn-off period is set to a second speed. The resistances 5621, 5622 have respective first ends connected to a gate via the switch 563 and respective second ends connected to the gate driving circuit 55. The gate resistance 562 may have other structures as long as it can change a changing speed of a gate voltage of the semiconductor element 3.

The switch 563 may switch resistance values of the gate resistance 562. The switch 563 may connect either one of the resistances 5621, 5622 to a gate of the semiconductor element 3. This enables switching a changing speed of a gate voltage between the first speed and the second speed.

The switch 563 may connect either one of the resistances 5621, 5622 to a gate of the semiconductor element 3 according to a signal from the OR gate 561. In the present embodiment, as one example, the switch 563 may connect the resistance 5622 to a gate in both a period during which a first pulse signal is generated after receiving a first timing signal that is a pulse signal and a period during which a second pulse signal is generated after receiving a second timing signal that is a pulse signal and may connect the resistance 5621 to gate during other periods. As a result, the driving condition change circuit 56 decreases a changing speed of a gate voltage in a period during which the first timing signal is generated after receiving the first timing signal and decreases a changing speed of a gate voltage in a period during which the second timing signal is generated after receiving the second timing signal.

According to an above described switching apparatus 1, in response to that a parameter satisfies a first condition, that is the voltage $Vds_{(2)}$ applied to the semiconductor element 2 on the opposing arm side decreases and changes to a first reference voltage (as one example, 0V) or less during a turn-off period of the semiconductor element 3 to be switched, a first timing signal is generated and a changing speed of a gate voltage of the semiconductor element 3 is decreased from the first speed to the second speed according to the generated signal. That is, a changing speed of a gate voltage of the semiconductor element 3 to be switched is set to be large until the voltage $Vds_{(2)}$ of the semiconductor element 2 on the opposing arm side becomes the first reference voltage and if the voltage $Vds_{(2)}$ of the semiconductor element 2 becomes the first reference voltage or less, the changing speed is set to be small. Accordingly, a turn-off loss can be reduced by making a turn-off period shorter than a case where a changing speed of a gate voltage is reduced at a moment at which the voltage $Vds_{(2)}$ applied to the semiconductor element 2 on the opposing arm side is larger than the first reference voltage. Further, voltage overshoot can be reduced because a changing speed of a gate charge is slowed than in a case where the voltage $Vds_{(2)}$ of the semiconductor element 2 on the opposing arm side becomes a reference voltage or less. It is possible to detect the short circuit between the positive side power supply line 101 and the negative side power supply line 102 and turn off the semiconductor element 3 by using a parameter for changing a changing speed of a gate voltage of the semiconductor element 3 because the semiconductor element 3 is turned off also in response to that a parameter satisfies a second condition during a time period in which the semiconductor element 3 is turned on. This enables further reducing an apparatus in size and suppressing an increase in a manufacturing cost than a case where a structure for detecting the short circuit is separately provided.

This can prevent an unnecessarily turning-off of the semiconductor element 3 if a parameter satisfying a second condition during a mask time period after turning on the semiconductor element 3 is normal because whether a parameter satisfies a second condition is determined at or after a time period at which the mask time period has elapsed after turning on the semiconductor element 3.

Voltage overshoot caused by turning off of the semiconductor element in a case where the short circuit is detected can be reduced because a changing speed of a gate voltage is set to be a second speed that is slower than a first speed during a turn-off period of the semiconductor element 3 according to a second timing signal generated in response to that a parameter satisfies a second condition during a time period in which the semiconductor element 3 is turned on.

A changing speed of a gate voltage returns to a first speed after a first timing signal having a first pulse width is already generated because the changing speed of the gate voltage slows down to the second speed during a time period in which the first timing signal is generated. Accordingly, in a case where the semiconductor element 3 is turned off according to an input signal, voltage overshoot can be reduced by decreasing a changing speed of a gate voltage to a second speed during a time period in which the voltage overshoot becomes peak. In a case where the first pulse width is set to be smaller than a time width from the start to the end of turning off of the semiconductor element 3, the changing speed of the gate voltage returns to the first speed after the first timing signal is already generated, and thus, the switching loss can be reduced by ending the turning off eerily.

A second timing signal having a second pulse width is generated in response to that a parameter satisfies a second condition during a time period in which the semiconductor element 3 is turned on, and the changing speed of the gate voltage of the semiconductor element 3 decreases during a time period in which the second timing signal is generated, and thus, the changing speed of the gate voltage returns to the first speed after the generation of the second timing signal. The second pulse width is larger than the first pulse width, and thus, the changing speed of the gate voltage becomes the second speed during a longer period than a case where the second pulse width is the first pulse width or less. This enables surely slowing down the changing speed of the gate voltage to the second speed during a time period in which the voltage overshoot becomes peak in a case where the semiconductor element 3 is turned off in response to the detection of the short circuit.

The second pulse width is larger than the time width from the start to the end of turning off of the semiconductor element 3, and thus, it is possible to more surely reduce the voltage overshoot caused by turning off of the semiconductor element in a case where the short circuit is detected.

A first timing signal can be generated in response to that a parameter surely satisfies a first condition unlike a case where a first timing signal is generated in response to that a predetermined time period from a time point at which turning off of a semiconductor element is started to a time point at which a parameter satisfies a first condition is elapsed because first, the determination circuit 52 determines whether a parameter satisfies a first condition during a turn-off period of the semiconductor element 3, and then, a first timing signal is generated based on a determination result. Accordingly, voltage overshoot caused by turning off of the semiconductor element 3 can be reduced by surely decreeing a changing speed of a gate voltage during a time period in which the voltage overshoot becomes peak.

It is possible to surely detect a timing to switch a changing speed of a gate voltage during a turn-off period of a semiconductor element and the occurrence of the short circuit because a first reference voltage and a second reference voltage used in the determination circuit 52 are 0V.

The second reference voltage is less than voltage between the positive side power supply line 101 and the negative side power supply line 102, and thus, a fact that voltage applied to the semiconductor element 2 on the opposing arm side in a case where the semiconductor element 3 is turned on is the second reference voltage or less means that the semiconductor element 2 is not in an OFF state. Accordingly, the short circuit can be surely detected.

The same single determination circuit 52 determines both whether a parameter satisfies a first condition and whether a parameter satisfies a second condition, and thus, the determination circuit 52 can detect both a timing to switch a changing speed of a gate voltage during a turn-off period of a semiconductor element and the occurrence of the short circuit.

[30 Operating Waveform]

Figure 3:
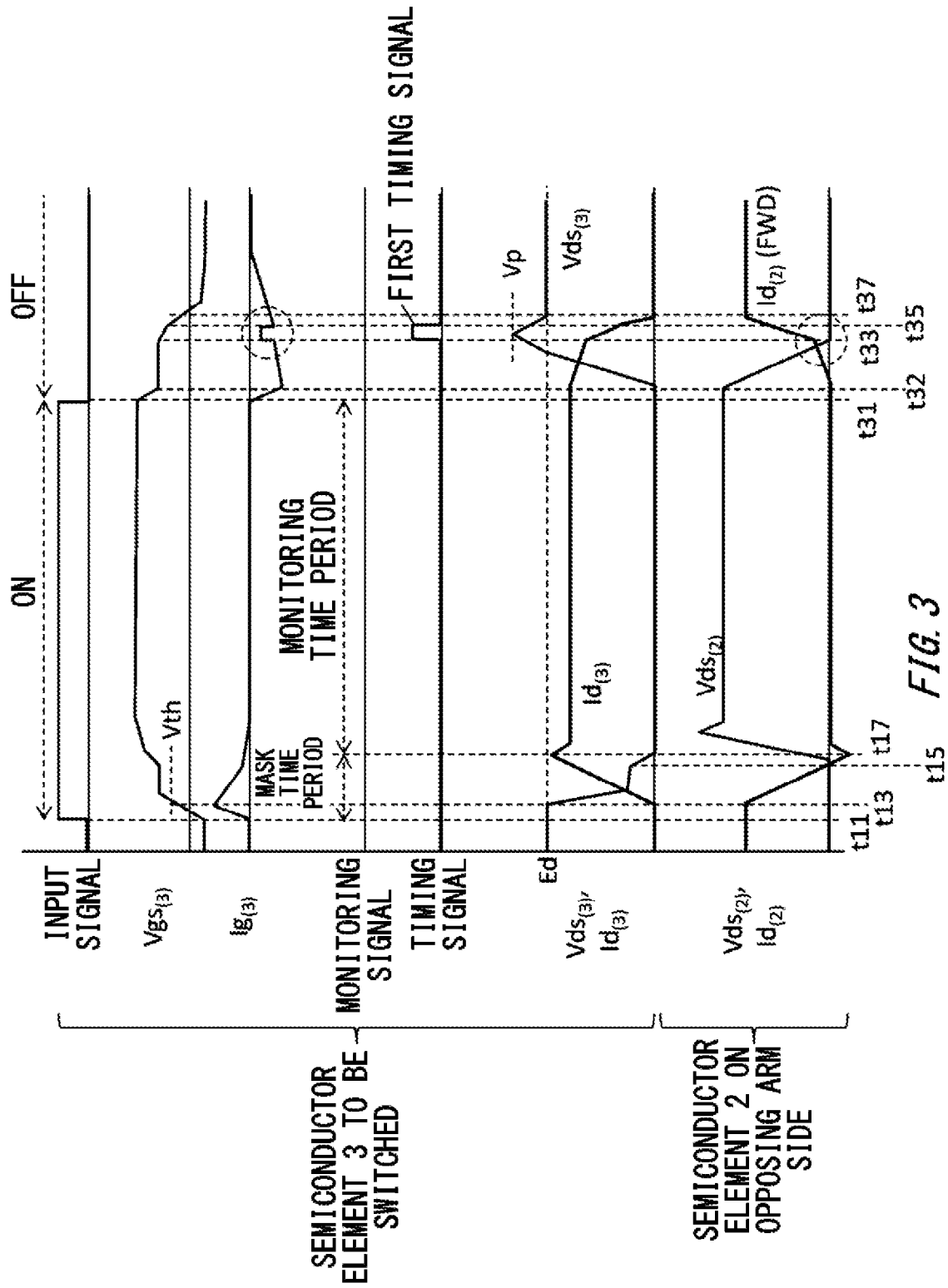
FIG. 3 illustrates an operating waveform of a switching apparatus 1.

FIG. 3 illustrates operating waveforms of a switching apparatus 1. In the figure, a horizontal axis represents a time, and a vertical axis represents a signal input to a driving apparatus 5, the gate-source voltage $Vgs_{(3)}$ of the semiconductor element 3 to be switched, the gate current $Ig_{(3)}$, the drain-source voltage $Vds_{(3)}$, the drain current $Id_{(3)}$, a monitoring signal from a short-circuit monitoring circuit 540, a timing signal from a timing generating circuit 54, the drain-source voltage $Vds_{(2)}$ of the semiconductor element 2 on the opposing arm side, and the drain current $Id_{(2)}$ (current flowing through a freewheeling diode). A reference numeral "Ed" in the figure indicates DC voltage between the positive side power supply line 101 and the negative side power supply line 102.

First, at time t11, upon the driving apparatus 5 receiving an input signal (an on command signal) for turning on the semiconductor element 3, a mask time period for monitoring the short circuit by the short-circuit monitoring circuit 540 starts. A turn-on signal is output from the gate driving circuit 55 and positive gate current $Ig_{(3)}$ starts to be flowed to a gate of the semiconductor element 3. Further, the gate-source voltage $Vgs_{(3)}$ of the semiconductor element 3 starts to be increased.

Next, at time t13, in a case where the gate-source voltage $Vgs_{(3)}$ of the semiconductor element 3 exceeds a threshold Vth, the drain-source voltage $Vds_{(3)}$ of the semiconductor element 3 starts to be decreased and the drain current $Id_{(3)}$ starts to be increased. The current $Id_{(2)}$ (FWD) flowing through a freewheeling diode of the semiconductor element 2 on the opposing arm side starts to be decreased. Next, at time t15, the drain-source voltage $Vds_{(2)}$ starts to be increased from 0V.

Upon the end of the mask time period at time t17, a monitoring time period for monitoring the short circuit by the short-circuit monitoring circuit 540 starts and continues until a time t31 that is a falling timing of the on command signal. In the present exemplary operation, the occurrence of the short circuit is not detected because the drain-source voltage $Vds_{(2)}$ of the semiconductor element 2 on the opposing arm side does not become 0V or less and a parameter does not satisfy a second condition during the monitoring time period.

Next, at time t31, upon the driving apparatus 5 receiving an input signal (an off command signal) for turning off the semiconductor element 3, a turn-off signal is output from the gate driving circuit 55 and negative gate current $Ig_{(3)}$ starts to be flowed through the semiconductor element 3. This causes the implantation of charges to a gate of the semiconductor element 3 in a reverse bias direction to be started. During a time period from time t31 to time t32, the gate input capacitance $Cgs_{(3)}$ of the semiconductor element 3 is charged in the reverse bias direction and the gate source voltage $Vgs_{(3)}$ decreases.

Next, when the gate source voltage $Vgs_{(3)}$ decreases down to Miller voltage at time t32, most of the gate charges is used for charging a feedback capacitance (a gate-drain capacitance), and then, the variation of the gate source voltage $Vgs_{(3)}$ becomes flat (so-called Miller period), and the drain-source voltage $Vds_{(3)}$ of the semiconductor element 3 increases.

In accordance with the above, in the semiconductor element 2 on the opposing arm side, the drain-source voltage $Vds_{(2)}$ decreases and discharge current flows from the parasitic capacitance $Cds_{(2)}$, and thus the drain current $Id_{(3)}$ of the semiconductor element 3 decreases and the voltage VL depending on the amount of current variation is applied to a wiring inductance 1021 of the negative side power supply line 102.

Next, at time t33, when the drain-source voltage $Vds_{(2)}$ of the semiconductor element 2 on the opposing arm side becomes zero (see a broken line frame on a lower side of the figure), the first timing signal generation circuit 541 generates a first timing signal having a first pulse width. In accordance with the above, the driving condition change circuit 56 corrects a turn-off signal and decreases a changing speed of a gate voltage of the semiconductor element 3 (see a broken line frame on an upper side of the figure) during a time period in which a first timing signal is generated after receiving the first timing signal. For example, the gate current $Ig_{(3)}$ is controlled at a negative constant value closer to zero. In the present embodiment, as one example, a time period during which the first timing signal is generated may be a time period from a time t33 to a time t35, and the time 35 may be before a time t37 at which turning off of the semiconductor element 3 ends described later.

At time t33, the drain-source voltage $Vds_{(2)}$ of the semiconductor element 2 on the opposing arm side has become zero and Miller period has ended in the semiconductor element 2 to be switched. Therefore, in the semiconductor element 3, the gate source voltage $Vgs_{(3)}$ starts to be decreased again and also the drain current $Id_{(3)}$ rapidly decreases and becomes zero at time t37.

When the drain-source voltage Vds(2) of the semiconductor element 2 on the opposing arm side becomes zero, the load current IL commutates into a parasitic diode of the semiconductor element 2 and at the same time Miller period ends in the semiconductor element 3 to be switched, and accordingly the drain current Id(3) decreases rapidly. This causes the voltage VL to be applied to a wiring inductance 1021 of the negative side power supply line 102 to be increased instantaneously and causes the drain-source voltage $Vds_{(3)}$ of the semiconductor element 3 to be increased to the peak voltage Vp. In the present exemplary operation, the peak voltage Vp decreases by a changing speed of a gate voltage decreased during a time period from time t33 to time t35. Nest, the drain-source voltage $Vds_{(3)}$ becomes the DC voltage Ed at time t37.

At or after time t37, charging to the gate input capacitance $Cgs_{(3)}$ of the semiconductor element 3 ends and turning off of the semiconductor element 3 ends.

Figure 4:
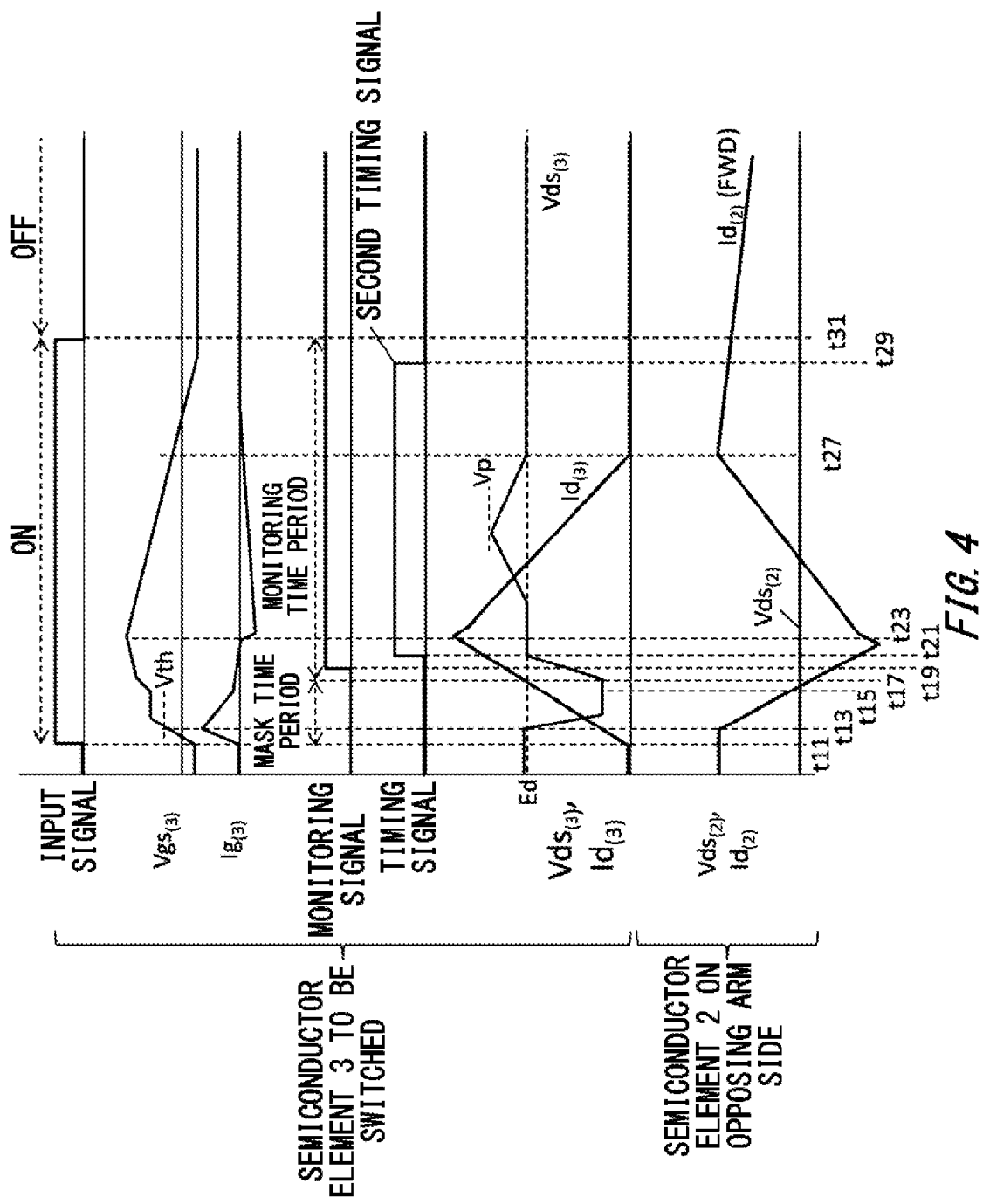
FIG. 4 illustrates another operating waveform of the switching apparatus 1.

FIG. 4 illustrates another operating waveform of a switching apparatus 1. Note that, in the present exemplary operation, the semiconductor element 2 on the opposing arm side is in an ON state due to a failure.

During a time period from time t11 to time t13, the apparatus performs operations to have the same operating waveforms as FIG. 3. In the present exemplary operation, at time t15, the drain-source voltage $Vds_{(2)}$ does not start to be increased but is maintained at 0V because the semiconductor element 2 on the opposing arm side is in an ON state due to a failure.

Nest, upon the end of a mask time period at time t17, a monitoring time period for monitoring the short circuit by the short-circuit monitoring circuit 540 starts and continues until a time t31 that is a falling timing of an on command signal. In the present exemplary operation, the drain-source voltage $Vds_{(2)}$ of the semiconductor element 2 on the opposing arm side becomes 0V or less and a parameter satisfies a second condition during a monitoring time period.

Therefore, at time t19, a monitoring signal becomes high in response to the detection of the occurrence of the short circuit, at time t23, a turn-off signal is output from the gate driving circuit 55 and the negative gate current $Ig_{(3)}$ starts to be flowed through the semiconductor element 3, and at time t27, turning off of the semiconductor element 3 ends. This eliminates short circuit states.

At time t21, the second timing signal generation circuit 542 generates a second timing signal having a second pulse width. In accordance with the above, the driving condition change circuit 56 corrects a turn-off signal output from the gate driving circuit 55 and decreases a changing speed of a gate voltage of the semiconductor element 3 during a time period in which the second timing signal is generated after receiving the second timing signal.

In the present exemplary operation, the peak voltage Vp decreases by a changing speed of a gate voltage lowered at or after time t21. In the present embodiment, as one example, a time period during which the second timing signal is generated may be a time period from time t21 to time t29, and time t29 may be later than time t27 at which turning off of the semiconductor element 3 ends. The second timing signal rises at time t21 and may not fall at or after time t21.

The times t19, t21 and t23 may be the same as time t17. The time t23 may be earlier than time t21.

[4. Modification Example]

Note that, in the above-mentioned embodiment, a first reference voltage used for generating a first timing signal has been described as the drain-source voltage $Vds_{(2)}$ of the semiconductor element 2 on the opposing arm side when the drain-source voltage $Vds_{(3)}$ of the semiconductor element 3 reaches the DC voltage Ed or more, but may be another voltage. For example, a first reference voltage may be the drain-source voltage $Vds_{(2)}$ when the drain current $Id_{(2)}$ starts to be commutated into a parasitic diode in the semiconductor element 2 on the opposing arm side.

Further, a parameter according to voltage applied to the semiconductor element 2 on the opposing arm side has been described as the drain-source voltage $Vds_{(2)}$ of the semiconductor element 2, but may be voltage (as one example, drain-source voltage $Vds_{(3)}$) applied to the semiconductor element 3 to be switched. In this case, a second condition used in the determination circuit 52 may be a condition in which the drain-source voltage $Vds_{(3)}$ is a fourth reference voltage or more, and the fourth reference voltage may be larger than 0V. This can surely detect the short circuit because a fact that a parameter satisfies a second condition when the semiconductor element 3 is turned on means that the semiconductor element 2 on the opposing arm side is not in an OFF state. A first condition may be a condition in which the drain-source voltage $Vds_{(3)}$ is a third reference voltage or more, a second condition may be a condition in which the drain-source voltage $Vds_{(3)}$ is a fourth reference voltage or more, and the third reference voltage and the fourth reference voltage may be the DC voltage Ed or more. This enables surely detecting timing for switching a changing speed of a gate voltage during a turn-off period and the occurrence of the short circuit.

The first condition and the second condition have been described as the same, but may be separate conditions. As one example, one of the first reference voltage and the second reference voltage may be 0V and the other may not be 0V. In a case where a first condition and a second condition differ from each other, the driving apparatus 5 may determine whether a parameter satisfies a first condition and whether a parameter satisfies a second condition by using separate different determination circuits. A determination circuit that determines whether a parameter satisfies a first condition may supplies a determination result to a first timing signal generation circuit 541, and an insulation signal transmitting unit 53 may be interposed between the determination circuit and the first timing signal generation circuit 541. A determination circuit that determines whether a parameter satisfies a second condition may supply a determination result to a short-circuit monitoring circuit 540, and an insulation signal transmitting unit 53 may be interposed between the determination circuit and the short-circuit monitoring circuit.

The switching apparatus 1 has been described as having a driving apparatus 4 that drives the semiconductor element 2 and a driving apparatus 5 that drives the semiconductor element 3 individually, but may have a single driving apparatus, obtained by integrating the driving apparatuses 4, 5, that drives each of the semiconductor elements 2, 3. In this case, the single driving apparatus may set either one of the drain-source voltage $Vds_{(2)}$ of the semiconductor element 2 and the drain-source voltage $Vds_{(3)}$ of the semiconductor element 3 as a parameter. This enables omitting either one of a measuring circuit for measuring the voltage $Vds_{(2)}$ and a measuring circuit for measuring the voltage $Vds_{(3)}$.

Further, the driving condition change circuit 56 has been described as changing a changing speed of a gate voltage by changing a resistance value of the gate resistance 562, but may change a changing speed by another method. The driving condition change circuit 56 may, for example, decrease the current of a turn-off signal or may stop the turn-off signal. To decrease the current of a turn-off signal, for example, an internal path of the turn-off signal toward a gate may be divided into paths to divide the current.

While the embodiments of the present invention have been described, the technical scope of the invention is not limited to the above described embodiments. It is apparent to persons skilled in the art that various alterations and improvements can be added to the above-described embodiments. It is also apparent from the scope of the claims that the embodiments added with such alterations or improvements can be included in the technical scope of the invention.

The operations, procedures, steps, and stages of each process performed by an apparatus, system, program, and method shown in the claims, embodiments, or diagrams can be performed in any order as long as the order is not indicated by "prior to," "before," or the like and as long as the output from a previous process is not used in a later process. Even if the process flow is described using phrases such as "first" or "next" in the claims, embodiments, or diagrams, it does not necessarily mean that the process must be performed in this order.

EXPLANATION OF REFERENCES

1 switching apparatus: 2 semiconductor element: 3 semiconductor element: 4 driving apparatus: 5 driving apparatus: 51 measuring circuit: 52 determination circuit: 53 insulation signal transmitting unit: 54 timing generating circuit: 55 gate driving circuit: 56 driving condition change circuit: 101 positive side power supply line: 102 negative side power supply line: 105 power supply output terminal: 511 resistance: 540 short-circuit monitoring circuit: 541 first timing signal generation circuit: 542 second timing signal generation circuit: 551 IF circuit: 552 OR gate: 561 OR gate: 562 gate resistance: 563 switch: 1011 wiring inductance: 1021 wiring inductance: 5621 resistance: 5622 resistance.

What is claimed is:
1. A driving apparatus comprising:
a gate driving circuit that turns off a first semiconductor element in response to receiving a signal for turning off the first semiconductor element included in the first semiconductor element and a second semiconductor element connected in series between a positive side power supply line and a negative side power supply line;
a measuring circuit that measures a parameter according to a voltage applied to the second semiconductor element;
a timing generating circuit that generates a first timing signal if the parameter satisfies a first condition during a time period in which the first semiconductor element is tuned off; and
a driving condition change circuit that, in response to the first timing signal, further decreases a changing speed of a gate voltage of the first semiconductor element than a reference speed during the time period in which the first semiconductor element is tuned off, wherein
the gate driving circuit turns off the first semiconductor element in also response to that the parameter satisfies a second condition during a time period in which the first semiconductor element is tuned on.

2. The driving apparatus according to claim 1, wherein
the gate driving circuit turns off the first semiconductor element in response to that the parameter satisfies the second condition at or after a time point at which a reference time has elapsed after turning on the first semiconductor element.

3. The driving apparatus according to claim 1, wherein
the timing generating circuit generates a second timing signal if the parameter satisfies a second condition during a time period in which the first semiconductor element is turned on; and
the driving condition change circuit, in response to the second timing signal, further decreases the changing speed of the gate voltage than the reference speed during a time period in which the first semiconductor element is turned off.

4. The driving apparatus according to claim 3, wherein
the timing generating circuit generates the first timing signal having a predetermined first pulse width; and
the driving condition change circuit decreases the changing speed of the gate voltage while the first timing signal is generated after receiving the first timing signal.

5. The driving apparatus according to claim 4, wherein
the timing generating circuit generates the second timing signal having a predetermined second pulse width larger than the first pulse width; and
the driving condition change circuit decreases the changing speed of the gate voltage while the second timing signal is generated after receiving the second timing signal.

6. The driving apparatus according to claim 5, wherein
the second pulse width is larger than a time width from a start to an end of a turn-off of the first semiconductor element.

7. The driving apparatus according to any one of claim 1, further comprising:
a first determination circuit that determines whether the parameter satisfies the first condition; and
a second determination circuit that determines whether the parameter satisfies the second condition.

8. The driving apparatus according to claim 7, wherein
the first condition and the second condition are same conditions; and the first determination circuit and the second determination circuit are same circuits.

9. The driving apparatus according to any one of claim 1, wherein
the parameter indicates a voltage applied to the second semiconductor element.

10. The driving apparatus according to claim 9, wherein
the second condition is a condition in which a voltage applied to the second semiconductor element is a second reference voltage or less; and
the second reference voltage is less than a voltage between the positive side power supply line and the negative side power supply line.

11. The driving apparatus according to claim 9, wherein
the first condition is a condition in which a voltage applied to the second semiconductor element is a first reference voltage or less;
the second condition is a condition in which a voltage applied to the second semiconductor element is a second reference voltage or less; and
at least one of the first reference voltage and the second reference voltage is 0 V.

12. The driving apparatus according to claim 1, wherein
the parameter indicates a voltage applied to the first semiconductor element.

13. The driving apparatus according to claim 12, wherein
the second condition is a condition in which a voltage applied to the first semiconductor element is a fourth reference voltage or more; and
the fourth reference voltage is larger than 0 V.

14. The driving apparatus according to claim 12, wherein
the first condition is a condition in which a voltage applied to the first semiconductor element is a third reference voltage or more;
the second condition is a condition in which a voltage applied to the first semiconductor element is a fourth reference voltage or more; and
at least one of the third reference voltage and the fourth reference voltage is equal to or greater than a voltage between the positive side power supply line and the negative side power supply line.

15. A switching apparatus comprising:
two semiconductor elements connected in series between a positive side power supply line and a negative side power supply line;
the driving apparatus according to claim 1 that drives a gate of one of the two semiconductor elements; and
the driving apparatus according to claim 1 that drives a gate of the other of the two semiconductor elements.

16. The switching apparatus according to claim 15, wherein
the two semiconductor elements are wide bandgap semiconductor elements.

* * * * *